United States Patent
Zheng et al.

(10) Patent No.: US 7,897,508 B2
(45) Date of Patent: Mar. 1, 2011

(54) METHOD TO ELIMINATE CU DISLOCATION FOR RELIABILITY AND YIELD

(75) Inventors: Wen Yue Zheng, Portland, OR (US); Gang Mao, Shanghai (CN); Jian Fei Cui, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 72 days.

(21) Appl. No.: 11/361,070

(22) Filed: Feb. 22, 2006

(65) Prior Publication Data

US 2007/0134913 A1 Jun. 14, 2007

(30) Foreign Application Priority Data

Dec. 14, 2005 (CN) .................. 2005 1 0111640

(51) Int. Cl.
*H01L 21/4763* (2006.01)
(52) U.S. Cl. .................. 438/631; 257/503; 257/774; 257/E23.145
(58) Field of Classification Search .................. 257/503, 257/508, 520, 774, E23.304, E23.143, E23.145, 257/E21.645; 438/98, 618, 645, 663, 629, 438/631, 687
See application file for complete search history.

(56) References Cited

U.S. PATENT DOCUMENTS

| | | | | |
|---|---|---|---|---|
| 6,069,068 A * | 5/2000 | Rathore et al. | .............. | 438/628 |
| 6,130,161 A * | 10/2000 | Ashley et al. | ................ | 438/687 |
| 6,136,680 A * | 10/2000 | Lai et al. | ..................... | 438/597 |
| 6,207,222 B1 * | 3/2001 | Chen et al. | .................. | 205/123 |
| 6,258,710 B1 * | 7/2001 | Rathore et al. | .............. | 438/628 |
| 6,287,954 B1 * | 9/2001 | Ashley et al. | ................ | 438/622 |
| 6,391,777 B1 * | 5/2002 | Chen et al. | ................... | 438/687 |
| 6,492,270 B1 * | 12/2002 | Lou | .......................... | 438/687 |
| 6,548,395 B1 * | 4/2003 | Woo et al. | ................... | 438/622 |
| 6,562,712 B2 * | 5/2003 | Liu et al. | ..................... | 438/631 |
| 6,709,970 B1 * | 3/2004 | Park et al. | ................... | 438/620 |
| 6,764,951 B1 * | 7/2004 | van Ngo | ..................... | 438/687 |
| 6,838,772 B2 * | 1/2005 | Saitoh et al. | ................ | 257/758 |
| 6,936,881 B2 * | 8/2005 | Yeo et al. | .................... | 257/310 |
| 6,949,832 B2 * | 9/2005 | Kunishima et al. | .......... | 257/762 |
| 7,033,929 B1 * | 4/2006 | Burke et al. | ................. | 438/638 |
| 7,067,919 B2 * | 6/2006 | Watanabe et al. | ........... | 257/758 |
| 7,074,709 B2 * | 7/2006 | Young | ........................ | 438/625 |
| 7,088,003 B2 * | 8/2006 | Gates et al. | ................. | 257/774 |
| 7,141,882 B2 * | 11/2006 | Watanabe | .................... | 257/758 |
| 7,173,337 B2 * | 2/2007 | Watanabe et al. | ........... | 257/758 |
| 7,201,784 B2 * | 4/2007 | Miller et al. | .................. | 51/308 |
| 2002/0037641 A1 * | 3/2002 | Ritzdorf et al. | ............. | 438/618 |
| 2002/0098681 A1 * | 7/2002 | Hu et al. | ..................... | 438/626 |
| 2002/0192944 A1 * | 12/2002 | Sonderman et al. | ......... | 438/637 |
| 2003/0116852 A1 * | 6/2003 | Watanabe et al. | ........... | 257/758 |

(Continued)

*Primary Examiner*—David Vu
(74) *Attorney, Agent, or Firm*—Kilpatrick Townsend and Stockton LLP (57) ABSTRACT

Embodiments in accordance with the present invention provide methods of forming a metal interconnect structure which avoid defects arising from copper migration. In accordance with particular embodiments, an electroplated copper feature is subjected to a brief thermal anneal prior to chemical mechanical polishing and subsequent formation of an overlying barrier layer. This thermal anneal intentionally provokes migration of the copper and resulting formation of hillocks or voids, which are then removed by a CMP step. The barrier layer may thus subsequently be formed over a defect-free surface, which has already experienced stress release along grain boundaries as a result of the thermal treatment.

14 Claims, 7 Drawing Sheets

U.S. PATENT DOCUMENTS

| | | | |
|---|---|---|---|
| 2003/0160326 A1* | 8/2003 | Uzoh et al. | 257/758 |
| 2003/0214043 A1* | 11/2003 | Saitoh et al. | 257/758 |
| 2004/0113277 A1* | 6/2004 | Chiras et al. | 257/774 |
| 2004/0132381 A1* | 7/2004 | Basol et al. | 451/5 |
| 2004/0224495 A1* | 11/2004 | Young | 438/622 |
| 2005/0121788 A1* | 6/2005 | Watanabe et al. | 257/751 |
| 2005/0184397 A1* | 8/2005 | Gates et al. | 257/774 |
| 2005/0186782 A1* | 8/2005 | Burke et al. | 438/638 |
| 2005/0212137 A1* | 9/2005 | Yamamoto et al. | 257/758 |
| 2005/0239278 A1* | 10/2005 | Li et al. | 438/618 |
| 2005/0266673 A1* | 12/2005 | Hu et al. | 438/618 |
| 2006/0121733 A1* | 6/2006 | Kilpela et al. | 438/681 |
| 2006/0252258 A1* | 11/2006 | Wu et al. | 438/638 |
| 2006/0286797 A1* | 12/2006 | Zhang et al. | 438/659 |

* cited by examiner

METHOD TO ELIMINATE CU DISLOCATION FOR RELIABILITY AND YIELD

CROSS-REFERENCES TO RELATED APPLICATIONS

This application claims priority to Patent Application No. 200510111640.0 of the People's Republic of China, filed Dec. 14, 2005, commonly assigned herewith and incorporated by reference herein for all purposes.

BACKGROUND OF THE INVENTION

The present invention is directed to integrated circuits and their processing for the manufacture of semiconductor devices. More particularly, the invention provides a method and device for manufacturing a metal inter-connect structure exhibiting reduced defects. Merely by way of example, the invention has been applied to a copper metal damascene structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form interchanging metal and dielectric layers, where the metal layers to not interact with each other in the form of noise.

As merely an example, aluminum metal layers have been the choice of material for semiconductor devices as long as such layers have been used in the first integrated circuit device. Aluminum had been the choice since it provides good conductivity and sticks to dielectric materials as well as semiconductor materials.

Most recently, aluminum metal layers have been replaced, in part, by copper interconnects. Copper interconnects have been used with low k dielectric materials to form advanced conventional semiconductor devices. Copper has improved resistance values of aluminum for propagating signals through the copper interconnect at high speeds.

As devices become smaller and demands for integration become greater, limitations in copper and low k dielectric materials include unwanted migration of Cu material into other portions of the integrated circuit. Accordingly, conducting copper features are typically encased within barrier materials such as silicon nitride, which impede the diffusion of the copper.

Cu dislocation at post-CMP copper surface and SiN cap is one of top killer mechanisms affecting copper backend reliability failures as well as electric failures. One example of such a failure is local bridging of two or multiple metal lines by HTOL stress.

Cu dislocation includes copper mass migration, void formation during grain growth, and grain boundary reorganization. Controlling Cu dislocation is a key solution to improve reliability and yield issues due to such related fail modes.

Figure 1A:
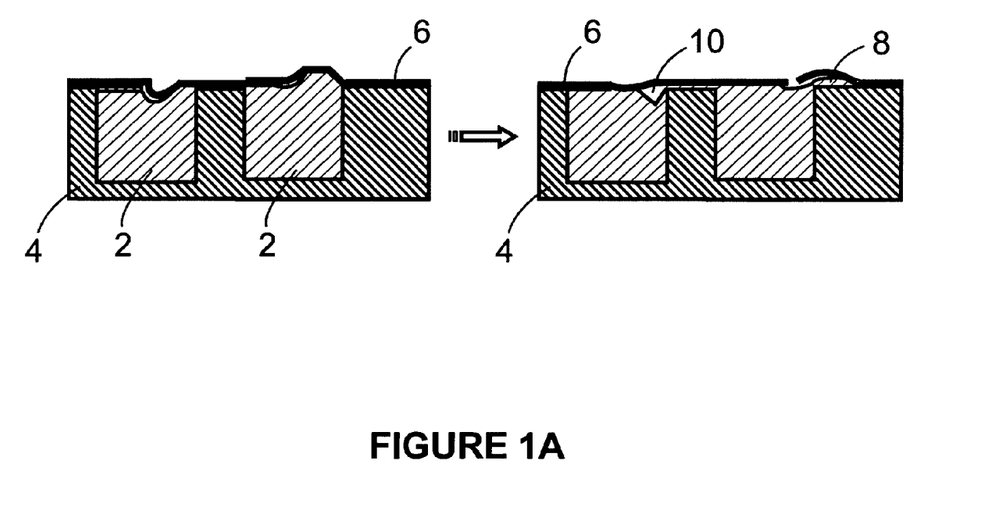
FIG. 1A is a simplified cross-sectional view of a copper structure experiencing unwanted copper migration in response to a thermal cycle.

FIG. 1A shows simplified cross-sectional view of a copper feature 2 formed within dielectric 4 and sealed by overlying silicon nitride barrier layer 6. FIG. 1A shows that the presence of topography such as hillocks 8 and voids 10 in the copper, can produce uneven thickness and passivation in the overlying SiN barrier layer. As a result, upon exposure of the copper-containing structure to a thermal cycle, stress release along grain boundaries of the copper can result in unwanted migration, breaking the SiN barrier.

Figure 1B:
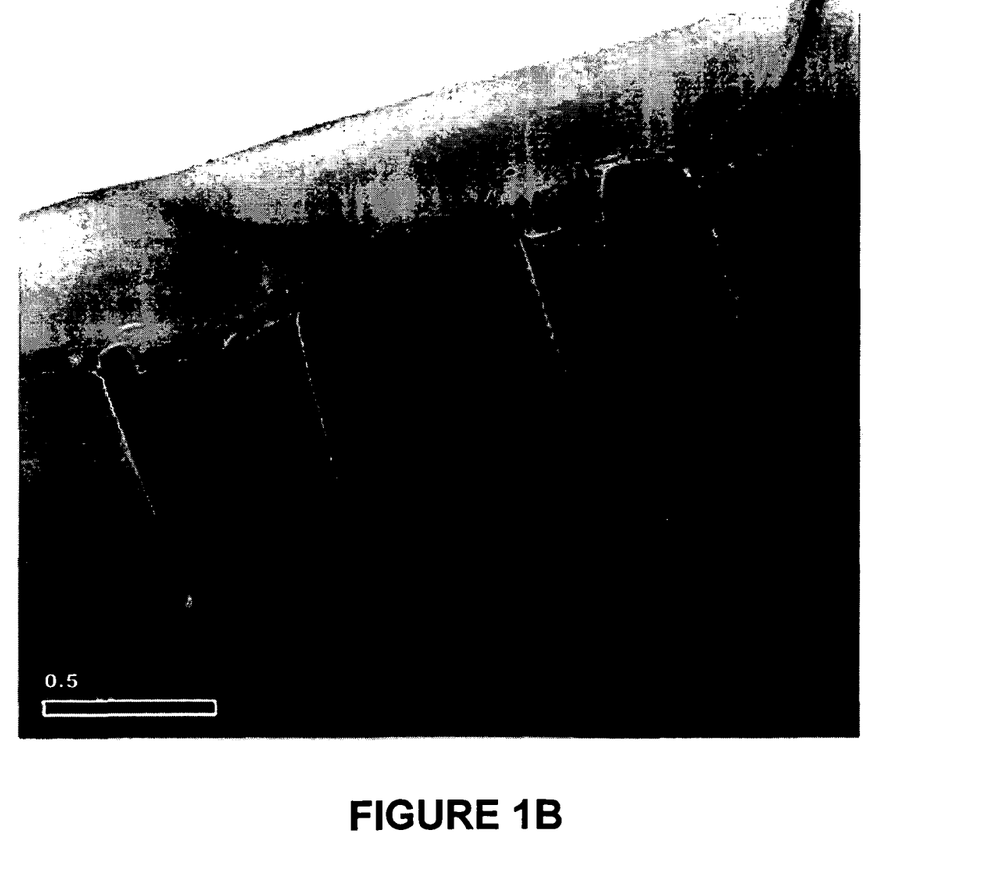
FIG. 1B is a TEM micrograph showing a cross section of metal bridging after stress due to copper dislocation.

FIG. 1B is a TEM micrograph showing a cross section of metal bridging after stress due to copper dislocation. FIG. 1B shows the electrically stressed metal lines fabricated without copper dislocation control, where bulk copper migration outside of trench is seen. This migration caused an electric short and destroyed the functionality of the die.

From the above, it is seen that an improved technique for processing semiconductor devices is desired.

BRIEF SUMMARY OF THE INVENTION

According to an embodiment of the present invention, the deleterious effects of migration of copper or other conducting material is avoided by briefly exposing metallization to a thermal anneal prior to chemical mechanical polishing and formation of an overlying capping/barrier layer. This brief thermal anneal intentionally provokes migration of the conducting material and formation of hillocks and voids therein, which may then be removed by a subsequent CMP step. The capping/barrier layer may subsequently be formed over a defect-free surface, which has already experienced release of stress along grain boundaries and migration in response to thermal treatment.

An embodiment of a method in accordance with the present invention for manufacturing integrated circuit devices including metal interconnect structures, comprises, providing a first dielectric material overlying a surface of a semiconductor substrate, the first dielectric material defining a trench. A conductor is formed within the trench and over the first dielectric material. The conductor is removed outside of the trench. The conductor is subjected to thermal energy to provoke migration of the conductor, and then the conductor is planarized.

An embodiment of a method in accordance with the present invention of fabricating a metallization structure in an integrated circuit, comprises, applying thermal energy to conducting material to provoke migration of the conductor prior to formation of an overlying capping layer, and then removing at least one of hillocks and voids resulting from the migration prior to forming the capping layer.

An embodiment of a semiconductor integrated circuit device structure in accordance with the present invention, comprises, a dielectric material, a conducting line formed in the dielectric material, and a capping layer overlying the conducting line. The conducting line is substantially free of voids or hillocks as a result of migration followed by chemical mechanical polishing prior to formation of the capping layer.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method of forming a metal interconnect structure avoiding unwanted migration of copper material by exposing a conducting feature to a brief thermal anneal prior to chemical mechanical polishing and subsequent formation of an overlying barrier layer. This thermal anneal intentionally provokes migration of the conductor and formation of hillocks and voids therein, which are then removed by a subsequent CMP step. The capping/barrier layer may thus subsequently be formed over a defect-free surface, which has already experienced release of stress at grain boundaries and migration in response to thermal treatment.

Merely by way of example, embodiments in accordance with the present invention have been applied to a copper metal damascene structure such as a dual damascene structure for advanced signal processing devices. But it would be recognized that the invention has a much broader range of applicability. For example, alternative embodiments in accordance with the present invention can be applied to form metallization structures comprising other than copper, for example aluminum, Al/Cu alloys, and gold. Other alternative embodiments in accordance with the present invention may be utilized in the fabrication of microprocessor devices, memory devices, and application specific integrated circuit devices, as well as various other interconnect structures.

A method according to an embodiment of the present invention can be briefly provided as follows:
1. Form interlayer dielectric layer overlying substrate;
2. Pattern the interlayer dielectric layer;
3. Form liner layer within the patterned interlayer dielectric layer;
4. Form copper metal layer within the liner layer of the patterned interlayer dielectric layer to a height above a surface of the interlayer dielectric layer;
5. Recrystallize copper metal layer;
6. Remove copper metal layer outside of interlayer dielectric;
7. Apply thermal energy to provoke migration in planarized copper metal layer;
8. Planarize copper metal layer to remove voids/hillocks resulting from migration;
9. Form capping layer overlying the metal layer; and
10. Perform other steps as desired.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 2A-E show simplified cross-sectional views of the steps of an embodiment of a process flow in accordance with the present invention. The steps shown in FIGS. 2A-E are part of a metallization process in a copper backend process flow.

Figure 2A:
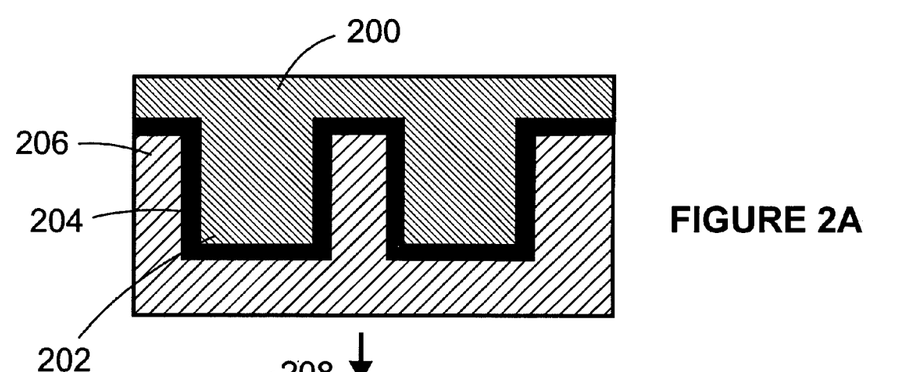
FIGS. 2A-2E show simplified cross-sectional views of a process flow for forming a Damascene structure.

The dielectric material may comprise a material sold under the trademark of SILK, or a material called BLACKDIAMOND of Applied Materials, Inc.

Figures 2B, 2C:
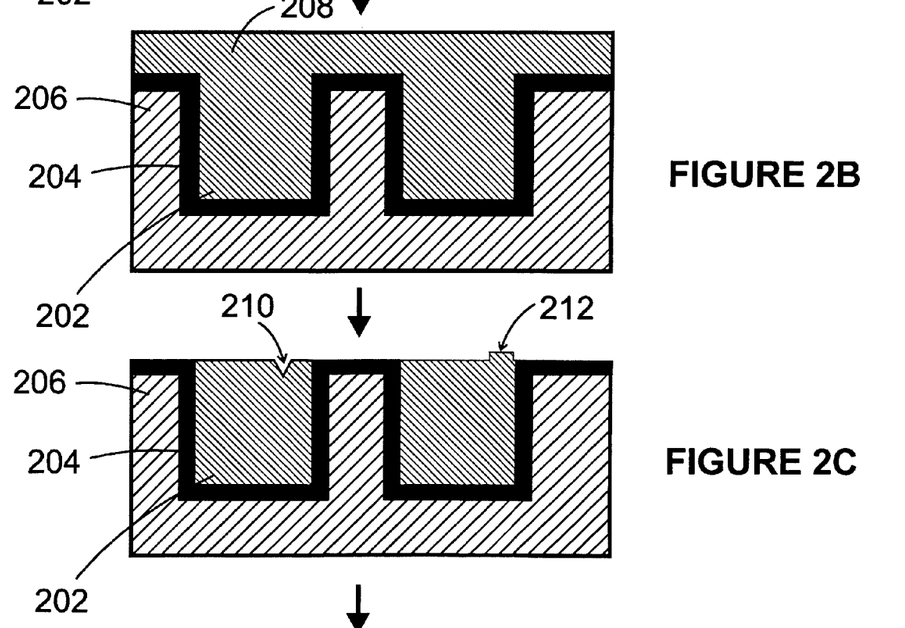

FIG. 2B shows the next step in the process, wherein after electroplating, optimal anneal conditions of low-temperature (about 180-220° C.) and duration (about 5-30 minutes in furnace) result in formation of stabilized copper microstructure 208. Conditions for annealing conditions during this recrystallization step to create mature copper, generally take place for longer periods and at lower temperatures than the subsequent migration-provoking step described below in connection with FIG. 2C.

FIG. 2C shows the next step, wherein mature copper is removed outside of the trench. In one particular embodiment, three-platen copper CMP with selective slurry combinations achieved good planarity of the structure within the die and over the wafer level. Backside (BS) polish on platen number three has been adjusted to appropriate down-force, slurry, and pad conditions to achieve minimal surface damage during this step.

FIG. 2C also shows application of the brief annealing step in accordance with embodiments of the present invention, to the metallization structure. This short annealing may be performed on a hot plate after the initial CMP, in order to relieve metal stress between grain boundaries, and to provoke copper migration in accordance with the present invention. FIG. 2C accordingly shows formation of void 210 and hillock 212 in stabilized copper microstructure 208. The short annealing during this step can be conducted at the temperature range of about 250-350° C. for about 30-90 seconds, in an inert gas ambient like $N_2$, Ar, He or others. The anneal performed during this step is in general higher in temperature and of shorter duration than that which takes place during the previous recrystallization step to form mature copper described in FIG. 2B.

Figure 2D:
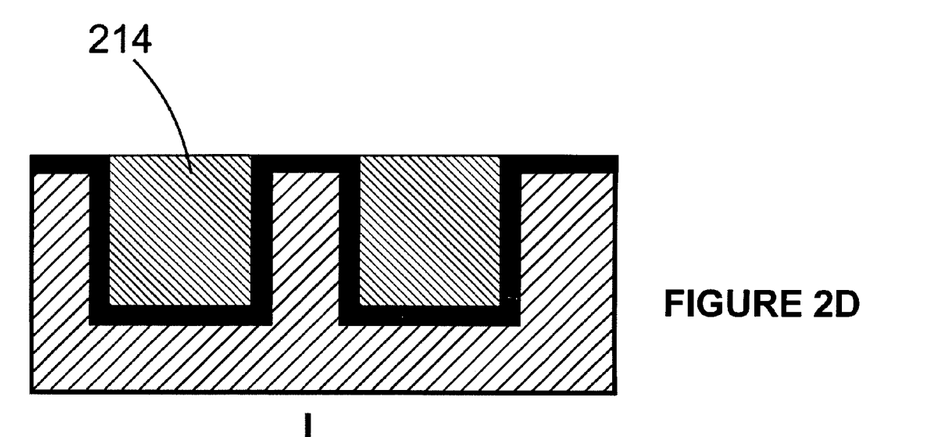

FIG. 2D shows the subsequent reworking of the metal surface with backside polishing in copper CMP, with low downforce and RPM to remove the hillocks and humps created during the previous brief thermal anneal in accordance with the present invention. The result is the formation of copper metal lines 214.

Figure 2E:
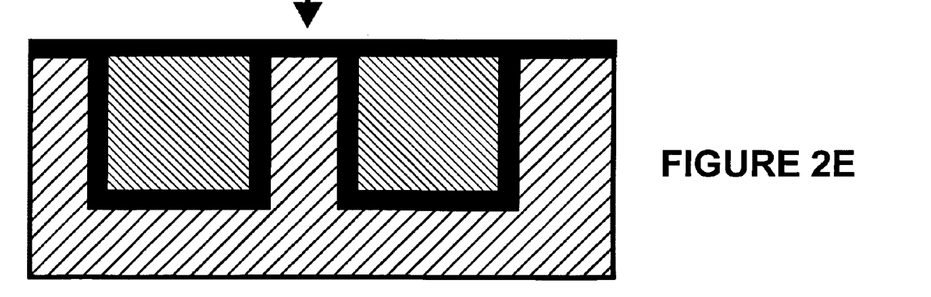

FIG. 2E shows formation of SiN by chemical vapor deposition (CVD) to encapsulate the copper metal lines resulting from the step shown in FIG. 2D. Conditions for pretreatment of wafers with hydrogen gas ($H_2$) and hot chuck stabilization may be optimized to achieve optimal gap fill during this step.

Figure 3:
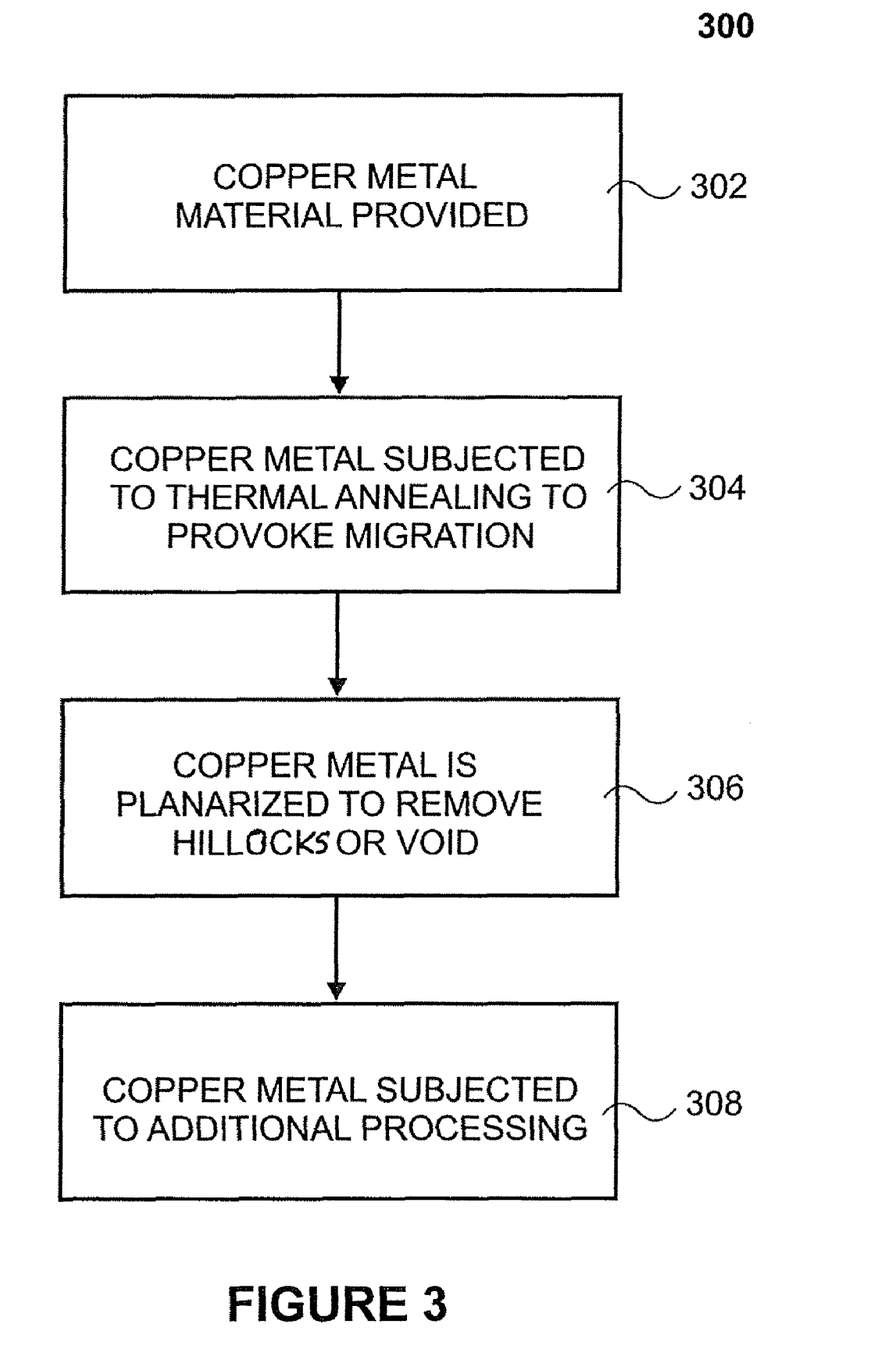
FIG. 3 shows a simplified flow diagram of the embodiment of the process flow in accordance with the present invention utilized to form the copper structure of FIG. 2.

FIG. 3 shows a simplified flow diagram of the embodiment of the process flow 300 in accordance with the present invention utilized to form the copper structure of FIG. 2E. In step 302, a copper metal material is provided, typically within a lined trench in a dielectric material. In step 304, the copper metal is subjected to thermal annealing to relieve stress between grain boundaries and provoke migration and consequent hillocks and/or void formation. In step 306, the copper material subjected to the brief thermal annealing is again planarized, thereby removing any void/hillock topography resulting from the brief thermal annealing process.

In step 308, the planarized copper material is exposed to subsequent processing, including thermal treatment. Because the copper has already been subjected to annealing and experienced the resulting copper migration, however, this subsequent processing results in little or no hillock formation.

Figure 4:
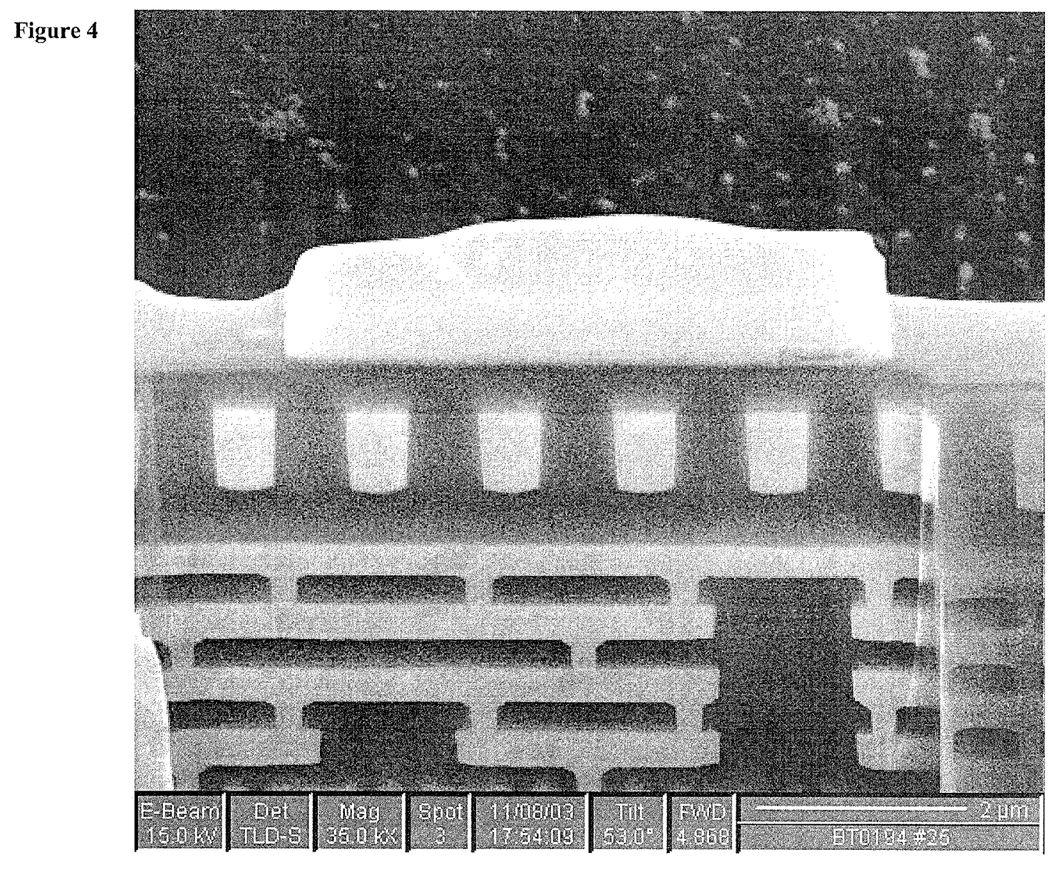
FIG. 4 shows an electron micrograph of a cross-section of a metal interconnect structure formed by a process flow according to an embodiment of the present invention.
Figure 4A:
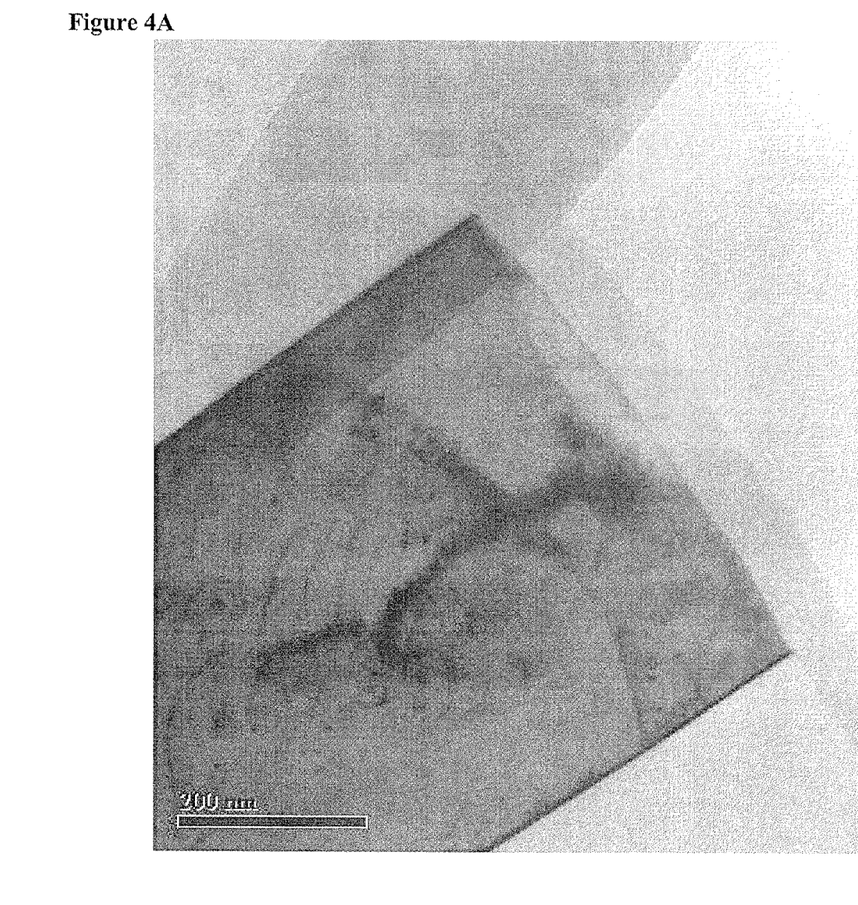
FIG. 4A shows an enlarged electron micrograph of a portion of the structure of FIG. 4 that is free of Cu dislocation defects.

Accordingly, FIG. 4 shows an electron micrograph of a cross-section of a metal interconnect structure formed by a process flow according to an embodiment of the present invention. FIG. 4A shows an enlarged electron micrograph of a portion of the structure of FIG. 4 that is free of Cu dislocation defects.

Embodiments in accordance with the present invention are able to significantly reduce or even eliminate Cu dislocation phenomena, and consequently improve device reliability and virgin yield. While embodiments in accordance with the instant invention are not limited to any particular design rule of material composition, particular embodiments have provided successful in fabricating general interconnect damascene metallurgy where either 0.13 μm fluorosilicate glass (FSG) or 90 nm low K dielectrics are used.

Many benefits are achieved by way of the present invention over conventional techniques. For example, utilizing Cu dislocation control in accordance with embodiments of the present invention, clean and smooth Cu/SiN interfaces may be obtained free of voids or the need to leave room for copper migration and diffusion. Thus according to embodiments of the present invention, Cu could be well encapsulated to create a reliable chip.

Moreover, embodiments in accordance with the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

While the specific embodiment described above has utilized copper metallization, the present invention is not limited to the use of this or any other particular electrically conducting material. Various different materials may be subjected to brief thermal annealing to provoke migration followed by planarization, and would remain within the scope of the present invention. For example, alternative embodiments in accordance with the present invention may be utilized to provoke migration of conducting metals other than copper, including but not limited to Aluminum (Al), Al(Cu) alloys, and gold. Certain of these alternative conducting materials would be formed by deposition techniques, rather than by the electroplating processes utilized to form copper.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuit devices including metal interconnect structures, the method comprising:

providing a first dielectric material overlying a surface of a semiconductor substrate, the first dielectric material defining a trench;

forming a conductor within the trench and over the first dielectric material, the first dielectric material including low K dielectric materials, the conductor having a surface region;

subjecting the conductor to thermal energy at a first temperature for a first duration of time to anneal the conductor;

removing the conductor outside of the trench by a first chemical mechanical polishing (CMP) step;

subjecting the conductor inside the trench and a surface of the first dielectric material to thermal energy at a second temperature for a second duration of time to provoke migration of the conductor, the thermal energy causing one or more void formation, the second temperature being higher than the first temperature, the second duration of time being shorter than the first duration of time, the second temperature being at least 250° C., the second duration of time being less than 90 seconds; and then planarizing the conductor by performing a second CMP step on the surface region of the conductor, the second CMP step removing the void formation.

2. The method of claim 1 wherein providing the first dielectric material comprises providing the first dielectric material having a liner within the trench.

3. The method of claim 1 wherein the first dielectric material is a material sold under the trademark of SILK or a material called BlackDiamond of Applied Materials, Inc.

4. The method of claim 1 wherein the conductor is formed within the trench by electroplating.

5. The method of claim 1 further comprising:

subjecting the conductor and the first dielectric material to hydrogen gas;

performing hot chuck stabilization;

capping the planarized conductor.

6. The method of claim 1 wherein planarizing the conductor removes one of voids and hillocks resulting from the migration.

7. The method of claim 1 wherein subjecting the conductor inside the trench and a surface of the first dielectric material to thermal energy is performed in an inert gas ambient, the second temperature is about 250-350° C., and the second duration of time is about 30-59 seconds.

8. The method of claim 1 further comprising recrystallizing the conductor after formation and prior to removal outside the trench.

9. The method of claim 1 wherein forming the conductor comprises forming at least one of aluminum (Al), a CuAl alloy, and gold.

10. The method of claim 1 further comprising forming an interlayer dielectric layer.

11. The method of claim 1 further comprising stabilizing the conductor at a temperature of about 180-220° C. for about 5-30 minutes.

12. The method of claim 1 wherein the first CMP step performed using platen number three.

13. The method of claim 1 wherein applying the thermal energy comprises subjecting the conductor to Ar or He gas.

14. A method for manufacturing integrated circuit devices including metal interconnect structures, the method comprising:
- providing a first dielectric material overlying a surface of a semiconductor substrate, the first dielectric material defining a trench;
- forming a conductor within the trench and over the first dielectric material, the first dielectric material including 0.13 um FSG material, the conductor having a surface region;
- subjecting the conductor to thermal energy at a first temperature for a first duration of time to anneal the conductor;
- removing the conductor outside of the trench by a first chemical mechanical polishing (CMP) step;
- subjecting the conductor inside the trench and a surface of the first dielectric material to thermal energy at a second temperature for a second duration of time to provoke migration of the conductor, the thermal energy causing one or more void formation, the second temperature being higher than the first temperature, the second duration of time being shorter than the first duration of time, the second temperature being at least 250° C., the second duration of time being less than 90 seconds;
- planarizing the conductor by performing a second CMP step on the surface region of the conductor, the second CMP step removing the void formation;
- subjecting the conductor and the first dielectric material to hydrogen gas;
- performing hot chuck stabilization; and
- performing chemical vapor deposition on the planarized conductor.

* * * * *